US 10,060,951 B2

(12) United States Patent
Ota

(10) Patent No.: US 10,060,951 B2
(45) Date of Patent: Aug. 28, 2018

(54) AMPLIFICATION CIRCUIT AND CURRENT SENSOR HAVING THE SAME

(71) Applicant: ALPS ELECTRIC CO., LTD., Tokyo (JP)

(72) Inventor: Masahiko Ota, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 335 days.

(21) Appl. No.: 14/978,519

(22) Filed: Dec. 22, 2015

(65) Prior Publication Data

US 2016/0187385 A1 Jun. 30, 2016

(30) Foreign Application Priority Data

Dec. 26, 2014 (JP) ................. 2014-266771

(51) Int. Cl.
| | |
|---|---|
| *G01R 15/14* | (2006.01) |
| *G01R 19/00* | (2006.01) |
| *H03F 3/387* | (2006.01) |
| *H03F 3/45* | (2006.01) |

(52) U.S. Cl.
CPC ....... *G01R 15/148* (2013.01); *G01R 19/0092* (2013.01); *H03F 3/387* (2013.01); *H03F 3/45475* (2013.01); *H03F 3/45986* (2013.01); *H03F 2200/165* (2013.01); *H03F 2200/261* (2013.01); *H03F 2203/45138* (2013.01); *H03F 2203/45212* (2013.01)

(58) Field of Classification Search
CPC ................ G01R 15/148; H03F 3/387; H03F 2203/45138; H03F 2200/261; H03F 1/26; H03F 3/45475; H03F 1/02
See application file for complete search history.

(56) References Cited

U.S. PATENT DOCUMENTS 7,535,295 B1 * 5/2009 Huijsing .................. H03F 1/26
327/124
2010/0033240 A1 2/2010 Denison et al.

* cited by examiner

*Primary Examiner* — Jermele M Hollington
*Assistant Examiner* — Brent J Andrews
(74) *Attorney, Agent, or Firm* — Beyer Law Group LLP

(57) ABSTRACT

In a case in which an input offset voltage of a main amplification circuit deviates from a predetermined range, a retaining operation of retaining an output voltage of a low pass filter in a sample and hold circuit stops, and an output voltage of the low pass filter is directly output to a correction signal supply circuit. As a result, for example, negative feedback control is not temporarily performed due to influence or the like of an excessive input voltage on the main amplification circuit, and in a case in which the input offset voltage of the main amplification circuit deviates from the predetermined range, a response delay due to the retaining operation of the sample and hold circuit does not occur, and the response speed of an offset correction circuit increases.

8 Claims, 9 Drawing Sheets

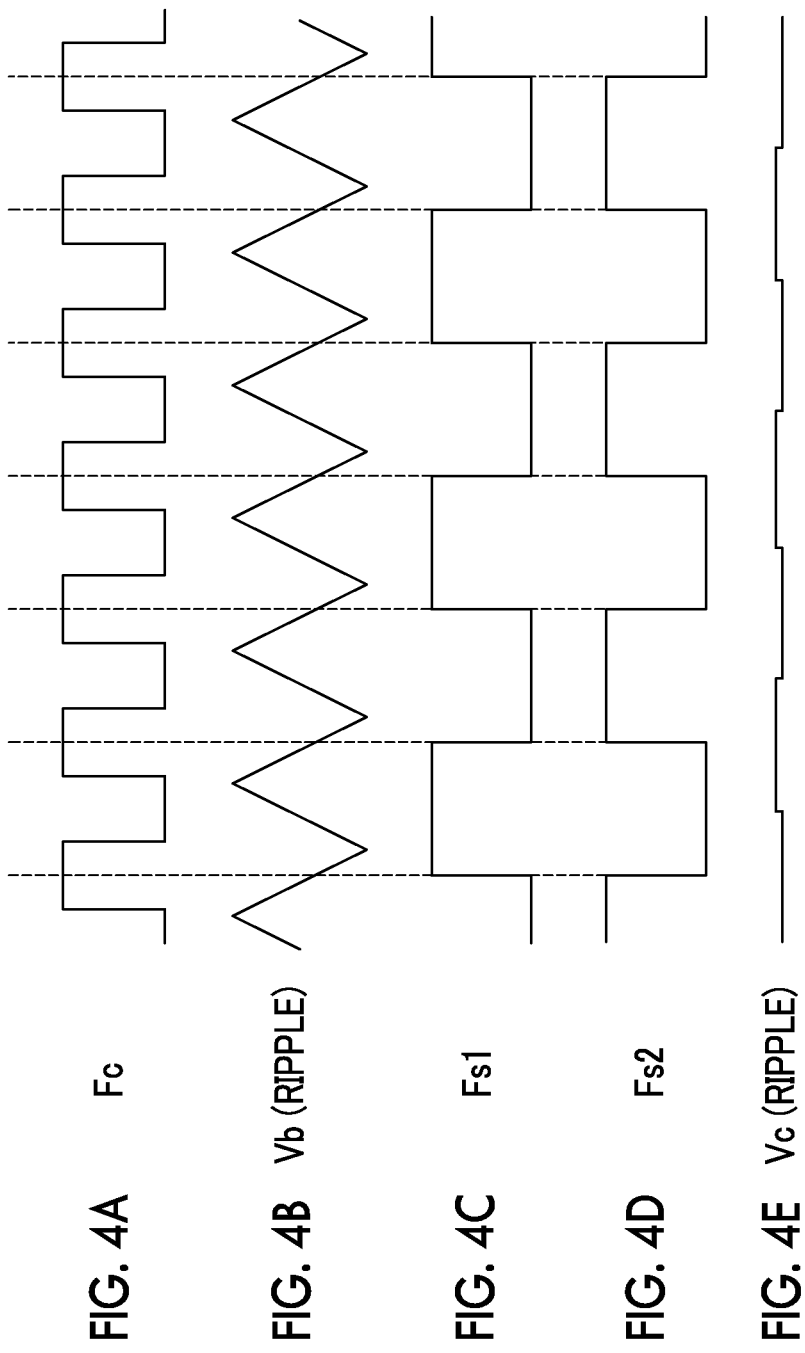

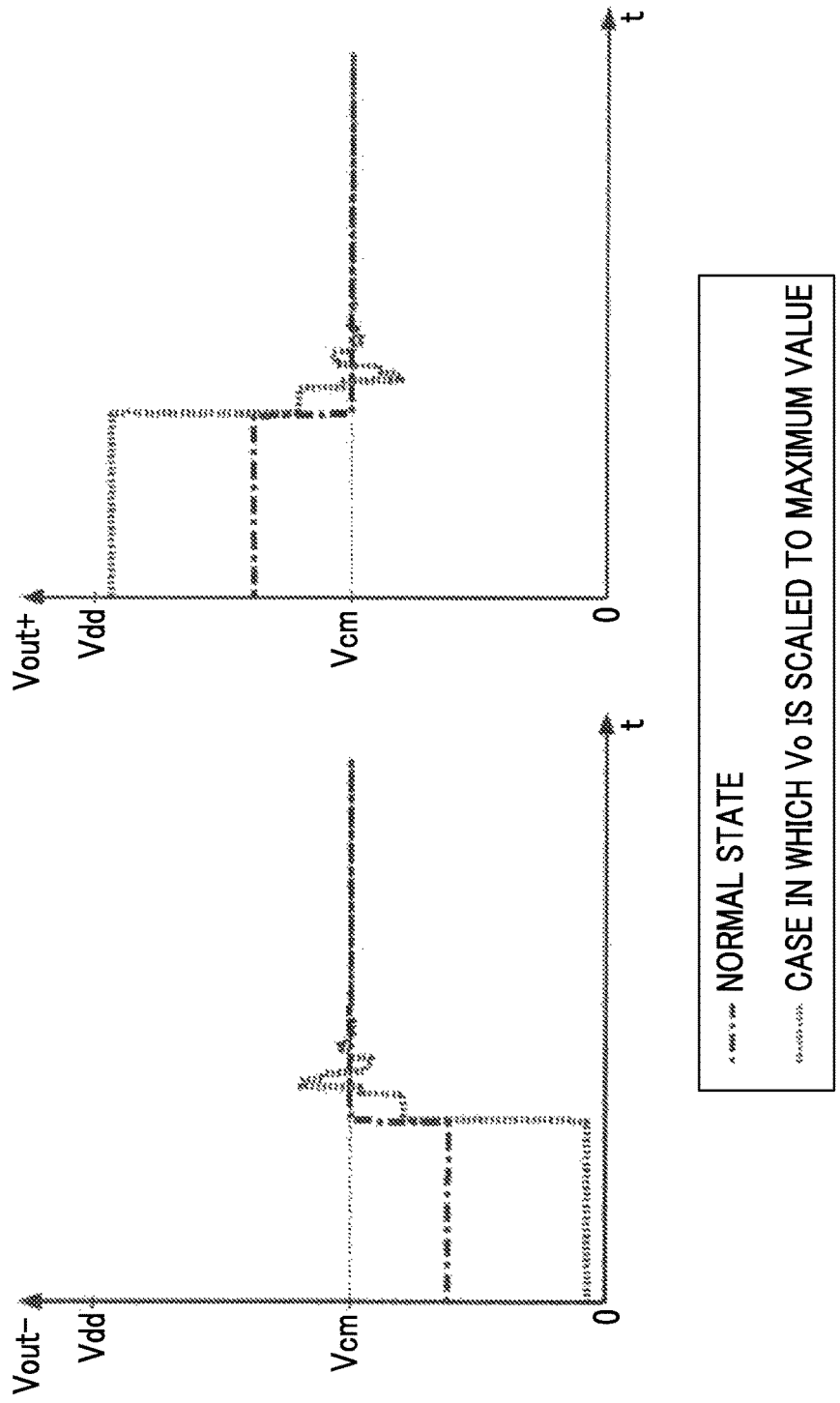

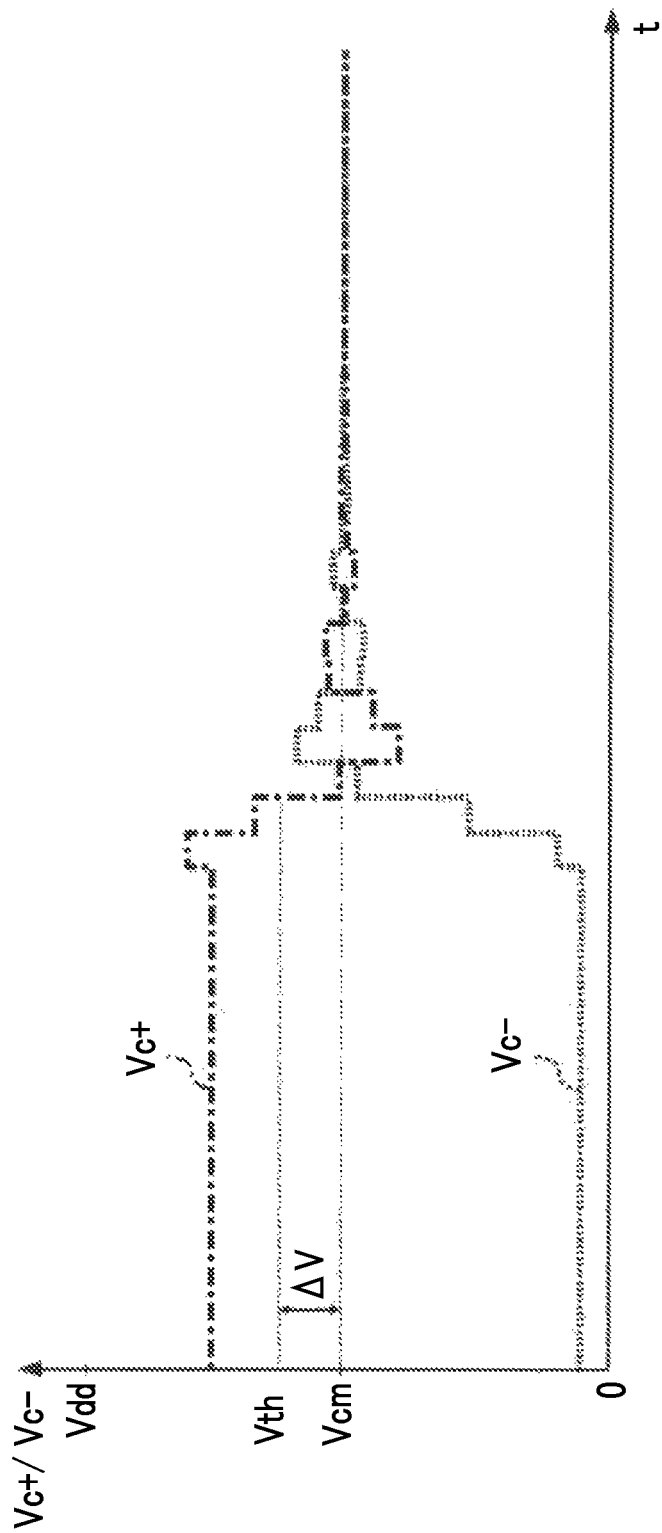

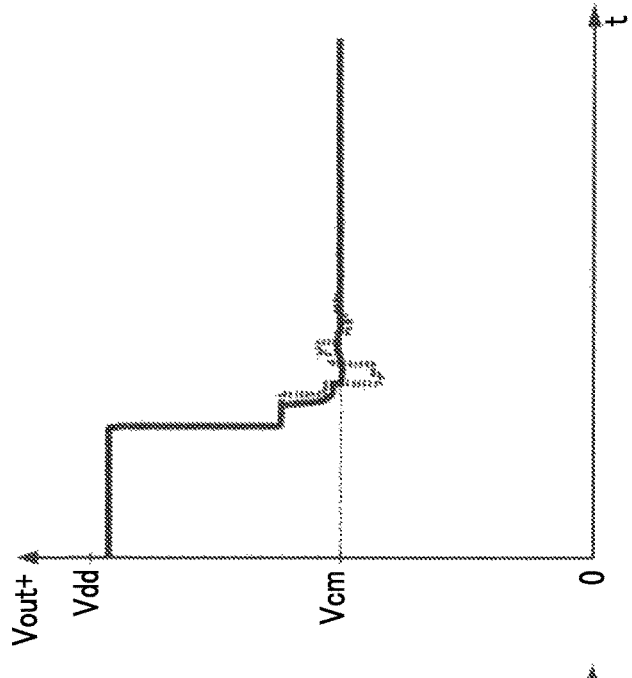
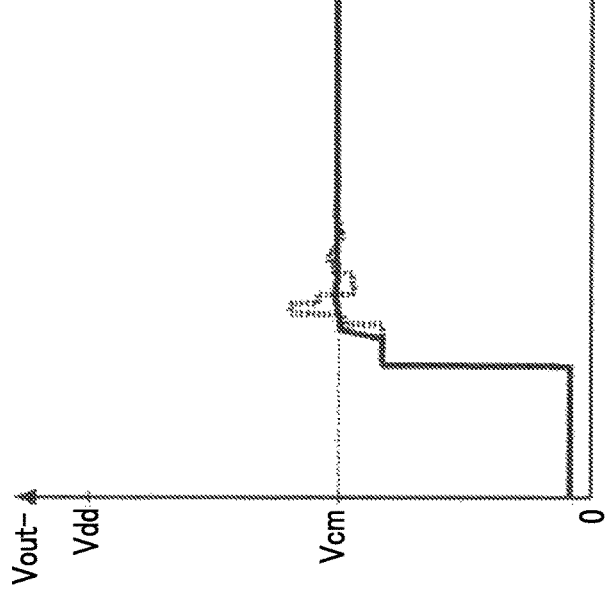

AMPLIFICATION CIRCUIT AND CURRENT SENSOR HAVING THE SAME

CLAIM OF PRIORITY

This application claims benefit of Japanese Patent Application No. 2014-266771 filed on Dec. 26, 2014, which is hereby incorporated by reference.

BACKGROUND OF THE INVENTION

1. Field of the Invention

The present invention relates to an amplification circuit which reduces drift of an input offset voltage using a chopper amplification circuit, and a current sensor which uses the amplification circuit.

2. Description of the Related Art

A chopper amplification circuit is widely used for a DC amplification circuit with high accuracy which reduces drift of an input offset voltage. A general chopper amplification circuit is configured by a switch circuit which modulates an input signal to a constant frequency, an amplifier which amplifies the modulated signal, and a switch circuit which demodulates the modulated signal amplified by the amplifier. Normally, a filter circuit for removing high frequency components included in a demodulated signal is provided in a rear stage of a chopper amplification circuit. In a case in which an input signal is directly amplified, drift components of an input offset voltage are also collectively amplified, and thus a large error due to the drift components is not generated in an output signal. Since the chopper amplification circuit converts an input signal into a modulated signal with a higher frequency than a frequency range of drift components, amplifies the modulated signal, and returns the modulated signal to a signal with an original frequency range by demodulating the modulated signal, and thus it is possible to sufficiently reduce the error due to the drift components.

The aforementioned chopper amplification circuit can be applied to a circuit for correcting an input offset voltage in an operational amplifier or the like having high accuracy and broadband. A chopper amplification circuit for amplifying the input offset voltage in a low drift is used for such an offset correction circuit. That is, negative feedback control is performed such that the input offset voltage amplified by the chopper amplification circuit approaches zero volts. The chopper amplification circuit is used exclusively for amplifying the input offset voltage close to a DC voltage, and the amplification of an input signal is performed by another fast amplifier. Hence, the response speed of an offset correction circuit, including the chopper amplification circuit, hardly influences frequency characteristics of the entire circuit during a normal operation state.

However, for example, in a case in which an excessive signal is input and an output is scaled out to a maximum level, or the like, a DC potential in a circuit can enter a saturation state greatly departed from a normal state. When the saturation state returns to the normal state, the response speed of an offset correction circuit becomes a problem. That is, since negative feedback control is not performed in the saturation state and the offset correction circuit operates temporarily and independently, the entire circuit cannot return to the normal state until the offset correction circuit independently returns to the normal state. Particularly, the response speed of a filter circuit provided in a rear stage of the chopper amplification circuit is delayed in the offset correction circuit, and thus recovery time for returning to the normal state becomes prolonged.

SUMMARY OF THE INVENTION

The present invention provides an amplification circuit which can reduce drift of an input offset voltage using a chopper amplification circuit, and can shorten recovery time to a normal state from a state in which negative feedback control is not normally performed due to influence of an excessive input signal or the like, and a current sensor including the amplification circuit.

According to a first aspect of the present invention, an amplification circuit includes a main amplification circuit configured to include a plurality of amplification stages connected in cascade, and to perform negative feedback of an output to an input; and an offset correction circuit configured to correct an input offset voltage of the main amplification circuit. The offset correction circuit includes a chopper amplification circuit configured to amplify the input offset voltage; a low pass filter configured to be provided in a rear stage of the chopper amplification circuit; a sample and hold circuit configured to retain an output signal of the low pass filter in synchronization with a chopper operation of the chopper amplification circuit, and to output the retained signal to the rear stage; a correction signal supply circuit configured to supply a correction signal according to an output signal of the sample and hold circuit to an intermediate node between the plurality of amplification stages which are connected in cascade; and a control circuit configured to control the sample and hold circuit such that, in a case in which the input offset voltage deviates from a predetermined range, a retaining operation of retaining the output signal of the low pass filter stops and the output signal of the low pass filter is directly output to the correction signal supply circuit.

According to the configuration, in a case in which the input offset voltage deviates from a predetermined range, the retaining operation of retaining the output signal of the low pass filter stops, and the output signal of the low pass filter in the sample and hold circuit is directly output to the correction signal supply circuit. As a result, for example, negative feedback control is not temporarily performed due to the influence or the like of an excessive input signal on the main amplification circuit, and in a case in which the input offset voltage deviates from the predetermined range, a response delay due to the sample and hold circuit does not occur, and the response speed of the offset correction circuit increases. Accordingly, negative feedback control is performed, and thereby recovery to the normal state becomes fast.

It is preferable that, in a case in which the input offset voltage enters the predetermined range after being in a state of deviating from the predetermined range, the control circuit controls the sample and hold circuit so as to restart the retaining operation of retaining the output signal of the low pass filter, after a predetermined delay time passes a point of time of entering the predetermined range.

As a result, even after the input offset voltage enters the predetermined range, the retaining operation of retaining the output signal of the low pass filter stops during a period of the delay time. For this reason, a state of a circuit remaining shortly before the input offset voltage enters the predetermined range returns rapidly to the normal state during the period of the delay time.

It is preferable that the control circuit determines whether or not the input offset voltage is within the predetermined range, on the basis of the output signal or the input signal of the sample and hold circuit.

As a result, it is correctly determined whether or not the input offset voltage is within the predetermined range, on the basis of a signal in which high frequency noise is removed from the low pass filter.

It is preferable that the control circuit detects a rate of change in the output signal or the input signal of the sample and hold circuit with respect to time, and adjusts the delay time in accordance with the detected rate of change in the output signal or the input signal with respect to time.

For example, the control circuit lengthens the delay time when the rate of change with respect to time decreases, and shortens the delay time when the rate of change with respect to time increases.

It is preferable that the sample and hold circuit includes a first capacitor and a second capacitor; a first switch circuit which connects the first capacitor to the output of the low pass filter; a second switch circuit which connects the first capacitor to an input of the correction signal supply circuit; a third switch circuit which connects the second capacitor to the output of the low pass filter; and a fourth switch circuit which connects the second capacitor to the input of the correction signal supply circuit. It is preferable that, in a case in which the input offset voltage is within the predetermined range, the control circuit alternately switches a first switching state in which the first switch circuit and the fourth switch circuit are turned on and the second switch circuit and the third switch circuit are turned off, and a second switching state in which the first switch circuit and the fourth switch circuit are turned off and the second switch circuit and the third switch circuit are turned on, in each individual cycle of the chopper operation.

In this case, it is preferable that, in a case in which the retaining operation of retaining the output signal of the low pass filter stops, all of the first switch circuit, the second switch circuit, the third switch circuit, and the fourth switch circuit are turned on.

As a result, in a case in which the retaining operation of retaining the output signal of the of the low pass filter stops, impedance of a path which connects an output of the low pass filter to an input of the correction signal supply circuit becomes small, and thus, the response speed becomes fast, and the recovery time for returning to the normal state is shortened.

It is preferable that, the control circuit performs switching of the first switching state and the second switching state at an intermediate point of time between timing when a signal level is switched by the chopper amplification circuit and timing when the signal level is switched after the timing.

According to a second aspect of the present invention, a current sensor includes a magnetic sensor configured to output a detection signal according to a magnetic field due to a measured current; a coil configured to generate a magnetic field in a direction in which the magnetic field due to the measured current acting on the magnetic sensor is cancelled; and a coil drive circuit configured to drive the coil so as to maintain a balance between the magnetic field due to the measured current acting on the magnetic sensor and the magnetic field due to the current flowing through the coil, in accordance with the detection signal, and the coil drive circuit includes the amplification circuit according to the first aspect.

According to the invention, it is possible to reduce drift of an input offset voltage using a chopper amplification circuit, and to shorten recovery time for returning to a normal state from a state in which negative feedback control is not normally performed due to influence of an excessive input signal or the like.

BRIEF DESCRIPTION OF THE DRAWINGS

FIGS. 4A to 4E are diagrams illustrating examples of signal waveforms of each unit in the amplification circuit illustrated in FIG. 1. FIG. 4A illustrates a clock signal for a chopper operation, FIG. 4B illustrates ripples of an output voltage of a low pass filter, FIG. 4C and FIG. 4D illustrate control signals of the sample and hold circuit, and FIG. 4E illustrates ripples of the output voltage of the sample and hold circuit;

FIGS. 5A and 5B are diagrams illustrating waveforms of the output voltage of the amplification circuit, in a case in which a retaining operation of the sample and hold circuit is continuously performed. FIG. 5A illustrates a negative voltage of the differential output, and FIG. 5B illustrates a positive voltage of the differential output;

FIG. 6 is diagram illustrating waveforms of the output voltages of the sample and hold circuit, in a case in which the retaining operation of the sample and hold circuit is continuously performed;

FIGS. 7A and 7B are diagrams for comparing waveforms of the output voltage of the amplification circuit, in a case in which the retaining operation of the sample and hold circuit is continuously performed, and in a case in which the retaining operation of the sample and hold circuit stops. FIG. 7A illustrates a negative voltage of the differential output, and FIG. 7B illustrates a positive voltage of the differential output;

DESCRIPTION OF THE PREFERRED EMBODIMENTS

First Embodiment

Figure 1:
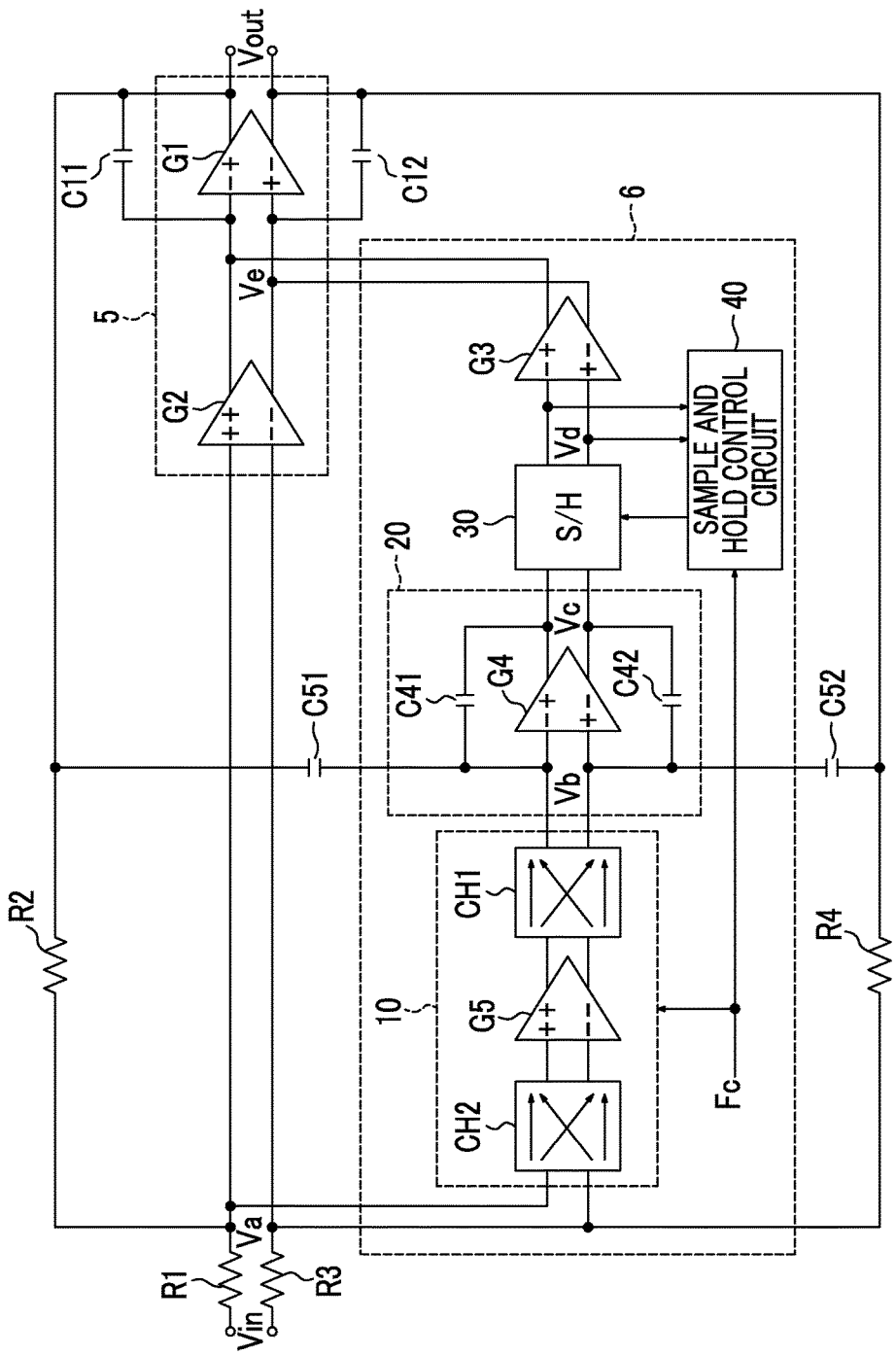
FIG. 1 is a diagram illustrating an example of a configuration of an amplification circuit according to an embodiment of the present invention.

FIG. 1 is a diagram illustrating an example of a configuration of an amplification circuit according to an embodiment of the present invention.

The amplification circuit illustrated in FIG. 1 includes a main amplification circuit 5 which amplifies an input signal, and an offset correction circuit 6 which corrects an input offset voltage of the main amplification circuit 5.

The main amplification circuit 5 includes two amplification stages G1 and G2 which are connected in cascade to each other. The amplification stage G2 amplifies an input voltage Va, and the amplification stage G1 further amplifies an output voltage Ve of the amplification stage G2. In an example of FIG. 1, the amplification stages G1 and G2 are operational amplifiers of a fully differential type, and respectively include two input terminals (inverting input terminal, non-inverting input terminal) and two output terminals (inverting output terminal, non-inverting output terminal). The non-inverting output terminal of the amplification stage G2 is connected to the inverting input terminal of the amplification stage G1, and the inverting output terminal of the amplification stage G2 is connected to the non-inverting input terminal of the amplification stage G1.

An output of the main amplification circuit 5 is negatively fed back to an input thereof by a feedback circuit of resistors R1 to R4. The resistor R2 is connected between the non-inverting output terminal of the amplification stage G1 and the non-inverting input terminal of the amplification stage G2, the resistor R3 is connected between the inverting output terminal of the amplification stage G1 and the inverting input terminal of the amplification stage G2, the resistor R1 is connected between the non-inverting input terminal of the amplification stage G2 and one input terminal of an input voltage Vin, and the resistor R2 is connected between the inverting input terminal of the amplification stage G2 and the other input terminal of the input voltage Vin. If resistance values of the resistors R1 and R3 are referred to as "Rb", and resistance values of the resistors R2 and R4 are referred to as "Rf", a voltage amplification factor becomes approximately "Rf/Rb".

The offset correction circuit 6 amplifies the input voltage Va of a first stage (amplification stage G2) of the main amplification circuit 5 which approaches zero volts by a negative feedback operation, as an input offset voltage, and supplies the amplified input offset voltage to an intermediate node (node which connects an output of the amplification stage G2 to an input of the amplification stage G1) of the main amplification circuit 5, as a correction signal. A correction signal of the offset correction circuit 6 is negatively fed back to an input of the main amplification circuit 5 through the amplification stage G1 of the main amplification circuit 5 and the feedback circuit (resistors R1 to R4). If the input voltage Va of the main amplification circuit 5 increases in the positive direction, a negative feedback is performed such that an increase of the input voltage Va in the positive direction is suppressed. In contrast to this, if the input voltage Va increases in the negative direction, the negative feedback is performed such that an increase of the input voltage Va in the negative direction is suppressed.

In the example of FIG. 1, the offset correction circuit 6 includes a chopper amplification circuit 10, a low pass filter 20, a sample and hold circuit 30, and a correction signal supply circuit G3.

The chopper amplification circuit 10 amplifies the input voltage Va of the main amplification circuit 5 through a chopper operation. The chopper amplification circuit 10 includes a chopper modulator CH1, a differential amplifier G5, and a chopper demodulator CH2, as illustrated in FIG. 1.

The chopper modulator CH1 modulates the input voltage Va in synchronization with a clock signal Fc. For example, the chopper modulator CH1 is configured by using a switching circuit which reverses a polarity of the input voltage.

The differential amplifier G5 amplifies a modulation signal of the input voltage Va which is modulated by the chopper modulator CH1. In the example of FIG. 1, the differential amplifier G5 is an operational amplifier of a fully differential type.

The chopper demodulator CH2 demodulates the modulation signal which is amplified by the differential amplifier G5 in synchronization with the clock signal Fc. For example, the chopper demodulator CH2 is configured by using a switching circuit which reverses a polarity of the output voltage of the differential amplifier G5.

The low pass filter 20 removes harmonic components (particularly, input offset voltage components of the differential amplifier G5 which become harmonics by the chopper operation of the chopper demodulator CH2) which are included in an output of the chopper amplification circuit 10. The low pass filter 20 includes, for example, a differential amplifier G4 and capacitors C41 and C42, as illustrated in FIG. 1. The differential amplifier G4 is an operational amplifier of a fully differential type, and the capacitors C41 and C42 are connected between an input and an output of the differential amplifier G4. The capacitor C41 is connected between a non-inverting output terminal and an inverting input terminal of the differential amplifier G4, and the capacitor C42 is connected between an inverting output terminal and a non-inverting input terminal of the differential amplifier G4.

The sample and hold circuit 30 is a circuit for removing ripples which are included in an output of the low pass filter 20, and operates a notch filter which attenuates frequency components of the clock signal Fc. The sample and hold circuit 30 retains an output voltage Vb of the low pass filter 20 in synchronization with a chopper operation of the chopper amplification circuit 10, and outputs the retained output voltage Vc to the correction signal supply circuit G3 in the rear stage.

Figure 2:
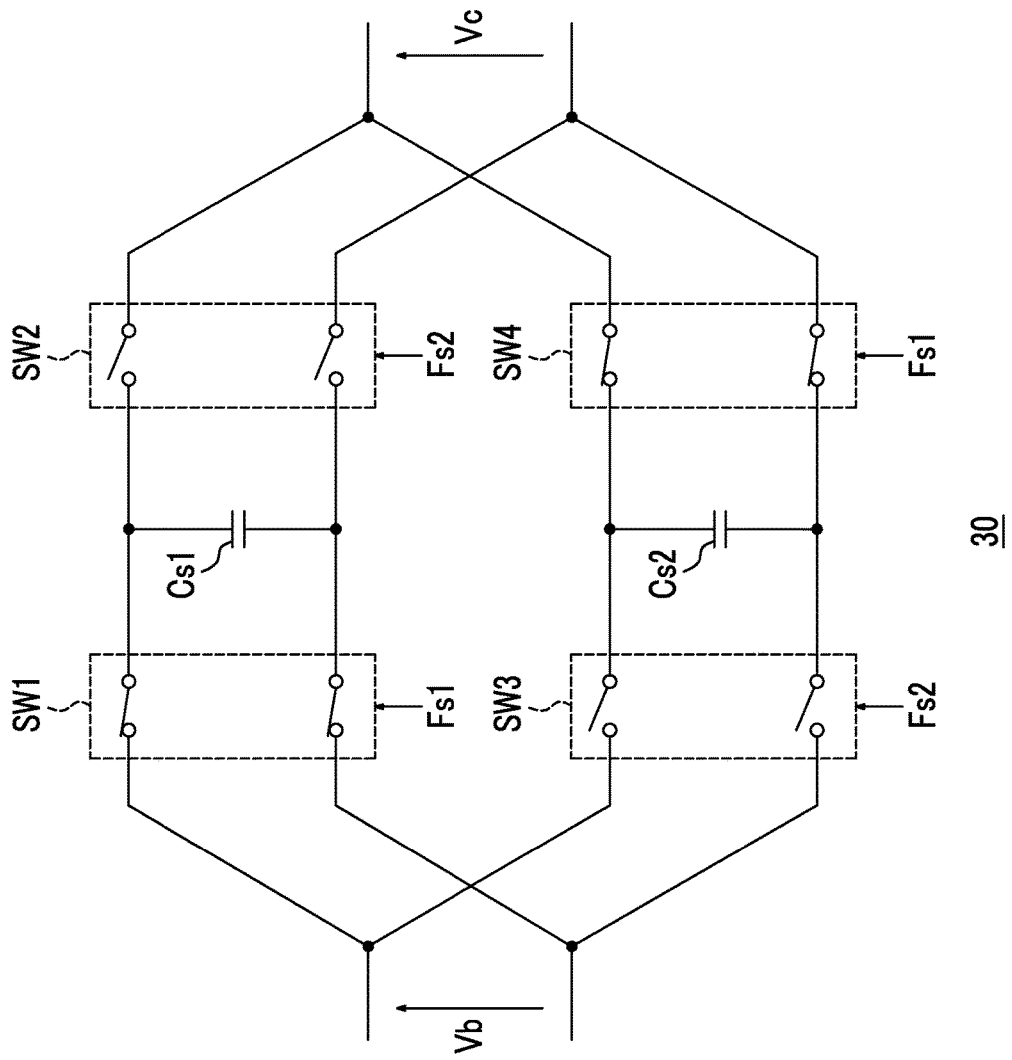
FIG. 2 is a diagram illustrating an example of a configuration of a sample and hold circuit.

The sample and hold circuit 30 includes a first capacitor Cs1, a second capacitor Cs2, a first switch circuit SW1, a second switch circuit SW2, a third switch circuit SW3, and a fourth switch circuit SW4, as illustrated in, for example, FIG. 2. The first switch circuit SW1 connects the first capacitor Cs1 to an output of the low pass filter 20. The second switch circuit SW2 connects the first capacitor Cs1 to an input of the correction signal supply circuit G3. The third switch circuit SW3 connects the second capacitor Cs2 to the output of the low pass filter 20. The fourth switch circuit SW4 connects the second capacitor Cs2 to an input of the correction signal supply circuit G3.

The correction signal supply circuit G3 supplies a correction signal according to the output signal (voltage Vc) of the sample and hold circuit 30 to an intermediate node between the amplification stage G1 and the amplification stage G2 which are connected in cascade to each other. The correction signal supply circuit G3 is configured by using an operational amplifier of a fully differential type.

The amplification circuit illustrated in FIG. 1 includes capacitors C11, C12, C51, and C52 for phase compensation, in order to ensure the stability of a high negative feedback system having a gain which is formed by the offset correction circuit 6, the amplification stage G1, and the feedback circuit (resistors R1 to R4). The capacitor C11 is connected between a non-inverting output terminal and an inverting input terminal of the amplification stage G1, and the capacitor C12 is connected between the inverting output terminal and the non-inverting input terminal of the amplification stage G1. In addition, the capacitor C51 is connected between the non-inverting output terminal of the amplification stage G1 and an inverting input terminal of the differential amplifier G4, and the capacitor C52 is connected between the inverting output terminal of the amplification stage G1 and a non-inverting input terminal of the differential amplifier G4.

A sample and hold control circuit 40 controls an operation of the sample and hold circuit 30.

In a normal operation, the sample and hold control circuit 40 alternately switches the first capacitor Cs1 and the second capacitor Cs2 to the output of the low pass filter 20 for a connection, in each individual cycle of the chopper operation of the chopper amplification circuit 10, and connects the capacitor which is disconnected from the output of the low pass filter 20 to the input of the correction signal supply circuit G3. That is, if the input offset voltage of the main amplification circuit 5 is within a predetermined range, the sample and hold control circuit 40 alternately switches a "first switching state" (state illustrated in FIG. 2) in which the first switch circuit SW1 and the fourth switch circuit SW4 are turned on and the second switch circuit SW2 and the third switch circuit SW3 are turned off, and a "second switching state" in which the first switch circuit SW1 and the fourth switch circuit SW4 are turned off and the second switch circuit SW2 and the third switch circuit SW3 are turned on, in each individual cycle of the chopper operation.

In this case, the sample and hold control circuit 40 shifts timing of switching of the "first switching state" and the "second switching state" and timing in which signal levels are switched by the chopper amplification circuit 10, only by a constant phase. For example, the sample and hold control circuit 40 performs the switching of the "first switching state" and the "second switching state", in a point of intermediate time between the timing at which the signal levels are switched by the chopper amplification circuit 10, and timing at which the signal levels are switched by the chopper amplification circuit 10 after the timing.

Meanwhile, in a case in which the input offset voltage of the main amplification circuit 5 is deviated from a predetermined range (a case in which negative feedback control is not performed by excessive input voltage Vin), the sample and hold control circuit 40 stops the retaining operation of retaining an output voltage Vc of the low pass filter 20, and controls the sample and hold circuit 30 such that the output voltage Vb of the low pass filter 20 is directly output to the correction signal supply circuit G3. That is, the sample and hold control circuit 40 controls the switch circuits SW1 to SW4 such that the output of the low pass filter 20 and the input of the correction signal supply circuit G3 enter a state of being continuously connected. For example, the sample and hold control circuit 40 turns on all the switch circuits SW1 to SW4.

In addition, in a case in which the input offset voltage of the main amplification circuit 5 enters a predetermined range after being in a state of deviating from the predetermined range, the sample and hold control circuit 40 controls the sample and hold circuit 30 such that the retaining operation of retaining the output voltage Vb of the low pass filter 20 restarts after a predetermined delay time passes from a point of time in which the input offset voltage enters the predetermined range. That is, the sample and hold control circuit 40 stops a sample and hold operation until the predetermined delay time passes, even after the input offset voltage enters the predetermined range, and inputs the output of the low pass filter 20 to the correction signal supply circuit G3 as it is.

Figure 3:
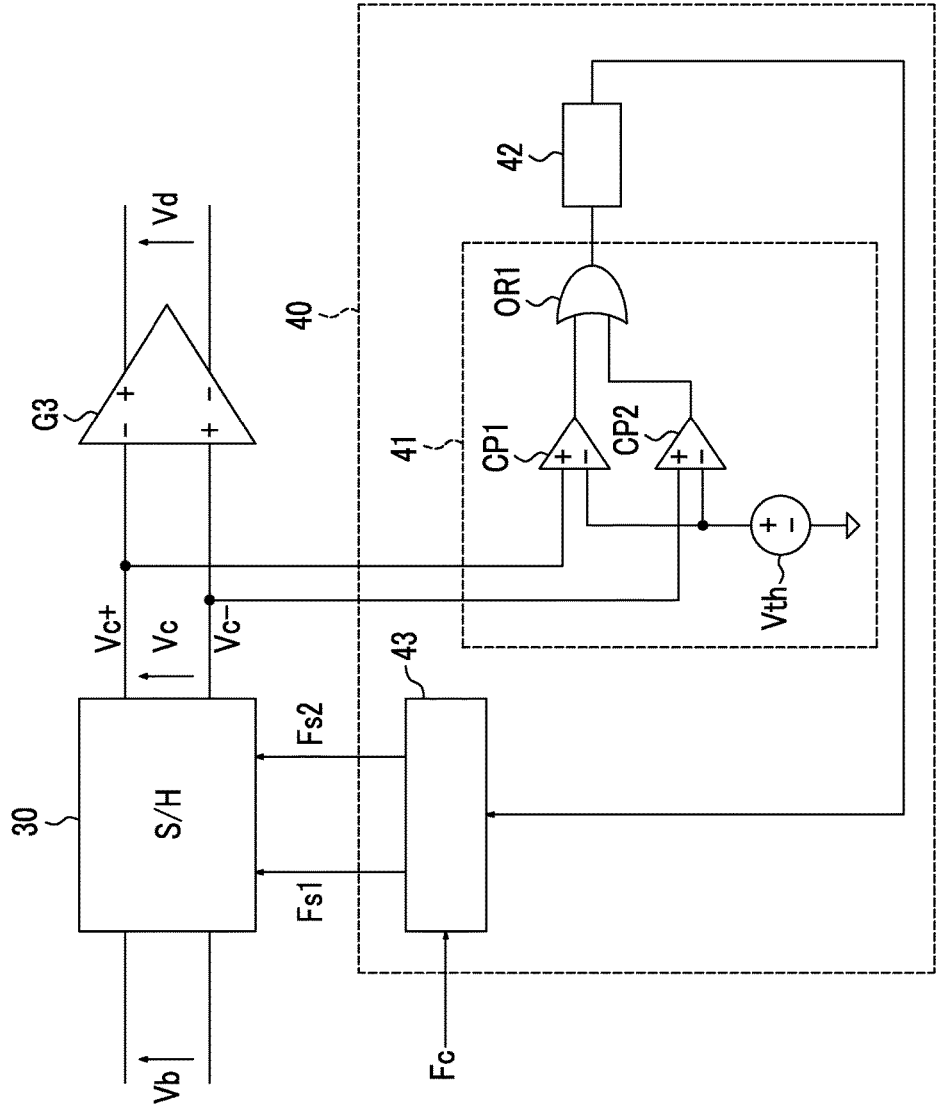
FIG. 3 is a diagram illustrating an example of a configuration of a sample and hold control circuit.

FIG. 3 is a diagram illustrating an example of a configuration of the sample and hold control circuit 40. The sample and hold control circuit 40 illustrated in FIG. 3 includes a determination circuit 41, a delay circuit 42, and a control signal generation circuit 43.

The determination circuit 41 determines whether or not the input offset voltage of the main amplification circuit 5 is within the predetermined range. The determination circuit 41 includes comparators CP1 and CP2, and a logical sum circuit OR1, as illustrated in, for example, FIG. 3.

The comparator CP1 compares one voltage Vc+ of differential voltages of the sample and hold control circuit 40 with a threshold voltage Vth, and outputs a signal with a high level in a case in which the voltage Vc+ is higher than the threshold voltage Vth, and a signal with a low level in a case in which the voltage Vc+ is lower than the threshold voltage Vth.

The comparator CP2 compares the other voltage Vc− of the differential voltages of the sample and hold control circuit 40 with the threshold voltage Vth, and outputs a signal with a high level in a case in which the voltage Vc− is higher than the threshold voltage Vth, and a signal with a low level in a case in which the voltage Vc− is lower than the threshold voltage Vth.

The threshold voltage Vth is set to a voltage which is slightly higher than the voltages Vc+ and Vc− (common mode voltage) when the output voltage Vc is zero. The common mode voltage is controlled to be half the power supply voltage by a common mode voltage control circuit which is not illustrated.

The logical sum circuit OR1 outputs a logical sum of output signals of the comparators CP1 and CP2 as a signal of a determination result. An output signal of the logical sum circuit OR1 reaches a high level in a case in which the input offset voltage deviates from the predetermined range, and reaches a low level in a case in which the input offset voltage is within the predetermined range.

The delay circuit 42 delays an output signal of the determination circuit 41 only by a predetermined delay time for outputting.

In a case in which an output signal of the delay circuit 42 is at a low level (a case in which the input offset voltage is within the predetermined range), the control signal generation circuit 43 generates a signal Fs1 which controls ON and OFF of the first switch circuit SW1 and the fourth switch circuit SW4, and a signal Fs2 which controls of ON and OFF of the second switch circuit SW2 and the third switch circuit SW3, on the basis of the clock signal Fc of the chopper operation. For example, the control signal generation circuit 43 generates the signals Fs1 and Fs2 in which frequencies thereof are half the frequency of the clock signal Fc and phases thereof are shifted only by a quarter of a cycle with respect to the clock signal Fc.

Meanwhile, in a case in which the output signal of the delay circuit 42 is at a high level (a case in which the input offset voltage deviates from the predetermined range), the control signal generation circuit 43 generates the signals Fs1 and Fs2 which turn on all of the first switch circuit SW1, the second switch circuit SW2, the third switch circuit SW3, and the fourth switch circuit SW4.

Here, an operation, which is in a normal state, of the amplification circuit illustrated in FIG. 1, having the configuration described above, will be described with reference to FIGS. 4A to 4E.

FIGS. 4A to 4E are diagrams illustrating examples of signal waveforms of each unit in the amplification circuit illustrated in FIG. 1. FIG. 4A illustrates the clock signal Fc for the chopper operation, FIG. 4B illustrates ripples of the output voltage Vb of the low pass filter, FIG. 4C and FIG. 4D illustrate the control signals Fs1 and Fs2 of the sample and hold circuit, and FIG. 4E illustrates ripples of the output voltage Vc of the sample and hold circuit.

The chopper modulator CH1 of the chopper amplification circuit 10 inverts the polarity of the input voltage Va of the main amplification circuit 5 from a positive polarity to a negative polarity or vice versa, in each half cycle of the clock signal Fc (FIG. 4A). In the same manner as this, the chopper demodulator CH2 also inverts the polarity of an output voltage of the differential amplifier G5. Inversions of the polarity are respectively performed in the rising and falling of the clock signal Fc. The sample and hold control circuit 40 inverts the levels of the control signals Fs1 and Fs2 (FIG. 4C, FIG. 4D), in an intermediate timing of the rising and the falling of the clock signal Fc, and performs switching of the "first switching state" and the "second switching state" of the sample and hold circuit 30.

The "first switching state" and the "second switching state" of the sample and hold circuit 30 are switched respectively and alternately in each individual cycle of the clock signal Fc. The output voltage Vb of the low pass filter 20 contains ripple components having the same cycle as the clock signal Fc, as illustrated in FIG. 4B. For this reason, the sample and hold circuit 30 repeats an operation of applying the output voltage Vb over one cycle of the ripple components to the respective two capacitors Cs1 and Cs2. Hence, voltages of the two capacitors Cs1 and Cs2 respectively approach an average value (DC components) of the output voltage Vb. Since the sample and hold circuit 30 alternately outputs the voltages of the two capacitors Cs1 and Cs2 as the output voltage Vc, the ripple components of the output voltage Vc is attenuated as illustrated in FIG. 4E.

Next, an operation when the negative feedback control is not normally performed, such as an operation when an output voltage Vout is scaled out to a maximum value by the excessive input voltage Vin, will be described with reference to FIGS. 5A to 7B.

A case in which the retaining operation of the sample and hold circuit 30 in the amplification circuit of FIG. 1 is continuously performed, will be described. In this case, the sample and hold circuit 30 repeats retention of the output voltage Vb of the low pass filter 20 in a timing synchronized with the clock signal Fc. In a state in which negative feedback control is not normally performed, a change of the output voltage Vc is delayed by the operation of the sample and hold circuit 30, and as a result, the time when the output voltage Vout is recovered to a normal level is delayed.

FIGS. 5A and 5B are diagrams illustrating waveforms of the output voltage Vout of the amplification circuit in a case in which the retaining operation of the sample and hold circuit 30 is continuously performed. FIG. 5A illustrates a negative voltage Vout− of the differential output, and FIG. 5B illustrates a positive voltage Vout+ of the differential output. Waveforms of one-dotted chain lines are waveforms in a case in which the output voltage Vout decreases to zero volts in the normal state. Waveforms of broken lines are waveforms in a case in which the output voltage Vout decreases to zero volts from a state of being scaled out to a maximum voltage.

As can be seen from the analysis by comparison, in a case in which the negative feedback control is normally performed, the output voltage Vout changes rapidly in accordance with the input voltage Vin. Meanwhile, if the output voltage Vout is scaled to a maximum value by the excessive input voltage Vin, the output voltage Vout does not immediately become zero volts, even though the input voltage Vin becomes zero volts. The voltages Vout+ and Vout− have waveforms which gradually converge to zero while repeating vibration, as illustrated in FIGS. 5A and 5B.

FIG. 6 is diagram illustrating waveforms of the output voltage Vc of the sample and hold circuit 30, in a case in which the retaining operation of the sample and hold circuit 30 is continuously performed. In a case in which the negative feedback control is normally performed, the output voltage Vc becomes approximately zero volts, and the positive voltage Vc+ and the negative voltage Vc− become approximately the same as a common mode voltage Vcom. If the negative feedback control is not normally performed by the excessive input voltage Vin, the voltage Vc of the sample and hold circuit 30 is greatly deviated from zero volts, as illustrated in FIG. 6. If the retaining operation of the sample and hold circuit 30 is continuously performed in a state in which the negative feedback control is not normally performed, the voltage Vc of the sample and hold circuit 30 does not immediately become zero volts, even though the input voltage Vin returns to zero volts. The voltages Vc+ and Vc− have waveforms which gradually converge to the common mode voltage Vcom while repeating vibration, as illustrated in FIG. 6.

In this way, when the negative feedback control is not normally performed by the excessive input voltage Vin, if the retaining operation of the sample and hold circuit 30 is continuously performed, a state in which the negative feedback control is not normally performed continues, even after the input voltage Vin returns to a normal level, and time until the output voltage Vout converges to a normal value becomes longer.

However, in the amplification circuit illustrated in FIG. 1, in a case in which the voltage Vc of the sample and hold circuit 30 is higher than a predetermined threshold voltage Vth, the input offset voltage is determined to deviate from a predetermined normal range, and the retaining operation of the sample and hold circuit 30 stops. In this case, the output voltage Vb of the low pass filter 20 passes through the sample and hold circuit 30 as it is, and is input to the correction signal supply circuit G3.

In addition, in the amplification circuit illustrated in FIG. 1, even though the voltages Vc+ and Vc− of the sample and hold circuit 30 are lower than the threshold voltage Vth and thereby the input offset voltage is determined to be within the predetermined range, the retaining operation of the sample and hold circuit 30 does not immediately restart. That is, until a predetermined delay time passes, the output voltage Vb of the low pass filter 20 is input to the correction signal supply circuit G3 as it is. This is because a state (state in which the voltages Vc+ and Vc− do not converge to the common mode voltage Vcom) in which negative feedback control is not normally performed, slightly continues, even after the voltages Vc+ and Vc− of the sample and hold circuit 30 become lower than the threshold voltage Vth, as illustrated in FIG. 6. In this state, if the retaining operation of the sample and hold circuit 30 restarts, recovery to a normal state is delayed.

If variation of the input offset voltage is considered, the difference ΔV between the threshold voltage Vth and the common mode voltage Vcom cannot become too small. In the amplification circuit illustrated in FIG. 1, an output signal of the determination circuit 41 is delayed by the delay circuit 42, and thereby the difference ΔV is sufficiently ensured, and recovery time for returning to the normal state is shortened.

FIGS. 7A and 7B are diagrams for comparing waveforms of the output voltage Vout of the amplification circuit, in a case in which the retaining operation of the sample and hold circuit 30 is continuously performed, and a case in which the retaining operation of the sample and hold circuit 30 stops. FIG. 7A illustrates the negative voltage Vout− of the differential output, and FIG. 7B illustrates the positive voltage Vout+ of the differential output. Waveforms of broken lines are waveforms in a case in which the output voltage Vout decreases to zero volts in a state in which the retaining operation of the sample and hold circuit 30 is continuously performed. Waveforms of solid lines are waveforms in a case in which the output voltage Vout decreases to zero volts in a state in which the retaining operation of the sample and hold circuit 30 is stopped by the sample and hold control circuit 40.

If the retaining operation of the sample and hold circuit 30 is continuously performed even in a case in which the negative feedback control is not performed by the excessive input voltage Vin or the like, the output voltage Vout slowly approaches zero volts while greatly vibrating, as denoted by the waveforms of dashed lines. Meanwhile, if the retaining operation of the sample and hold circuit 30 stops, the output voltage Vout becomes zero volts fast in accordance with the input voltage Vin. As can be seen from comparison of the waveforms, in the amplification circuit illustrated in FIG. 1, a control in which the retaining operation of the sample and hold circuit 30 is stopped by the sample and hold control circuit 40 is performed, and thus the recovery time for returning to the normal state is shortened.

As described above, according to the amplification circuit illustrated in FIG. 1, in a case in which the input offset voltage of the main amplification circuit 5 deviates from the predetermined range, the retaining operation of retaining the output voltage Vb of the low pass filter 20 in the sample and hold circuit 30 stops, and the output voltage Vb of the low pass filter 20 is directly output to the correction signal supply circuit G3. As a result, for example, the negative feedback control is not temporarily performed due to influence or the like of the excessive input voltage Vin on the main amplification circuit 5, and in a case in which the input offset voltage of the main amplification circuit 5 deviates from the predetermined range, a response delay due to the retaining operation of the sample and hold circuit 30 does not occur, and the response speed of the offset correction circuit 6 increases. For this reason, it is possible to reduce drift of the input offset voltage using the chopper amplification circuit 10, and to shorten the time needed for the negative feedback control to return to a normal state.

In addition, according to the amplification circuit illustrated in FIG. 1, in a case in which the input offset voltage deviates from the predetermined range, the retaining operation of retaining the output voltage Vb of the low pass filter 20 continues to stop, until a predetermined delay time passes, even after the input offset voltage enters the predetermined range again. As a result, a state (state in which the negative feedback control is not performed) of a circuit remaining shortly before the input offset voltage enters the predetermined range returns rapidly to the normal state during a period of delay time, and thus, it is possible to shorten the time needed for the negative feedback control to return to the normal state.

Furthermore, according to the amplification circuit illustrated in FIG. 1, in a case in which the retaining operation of retaining the output voltage Vb of the chopper amplification circuit 10 in the sample and hold circuit 30 stops, all of the first switch circuit SW1, the second switch circuit SW2, the third switch circuit SW3, and the fourth switch circuit SW4 are turned on.

As a result, impedance of a path which connects the output of the low pass filter 20 to the input of the correction signal supply circuit G3 becomes small, and thus, speed in which a signal is transferred through the path becomes fast. For this reason, it is possible to further shorten the time needed for the negative feedback control to return to the normal state.

However, the amplification circuit illustrated in FIG. 1, determines whether or not the input offset voltage is within the predetermined range, on the basis of the output voltage Vb of the sample and hold circuit 30, and thus it is possible to correctly determine whether or not the input offset voltage is within the predetermined range, on the basis of the signal which is obtained by removing harmonics from the low pass filter 20.

A modification example of the sample and hold control circuit 40 in the amplification circuit according to the present embodiment will be described with reference to FIG. 8.

Figure 8:
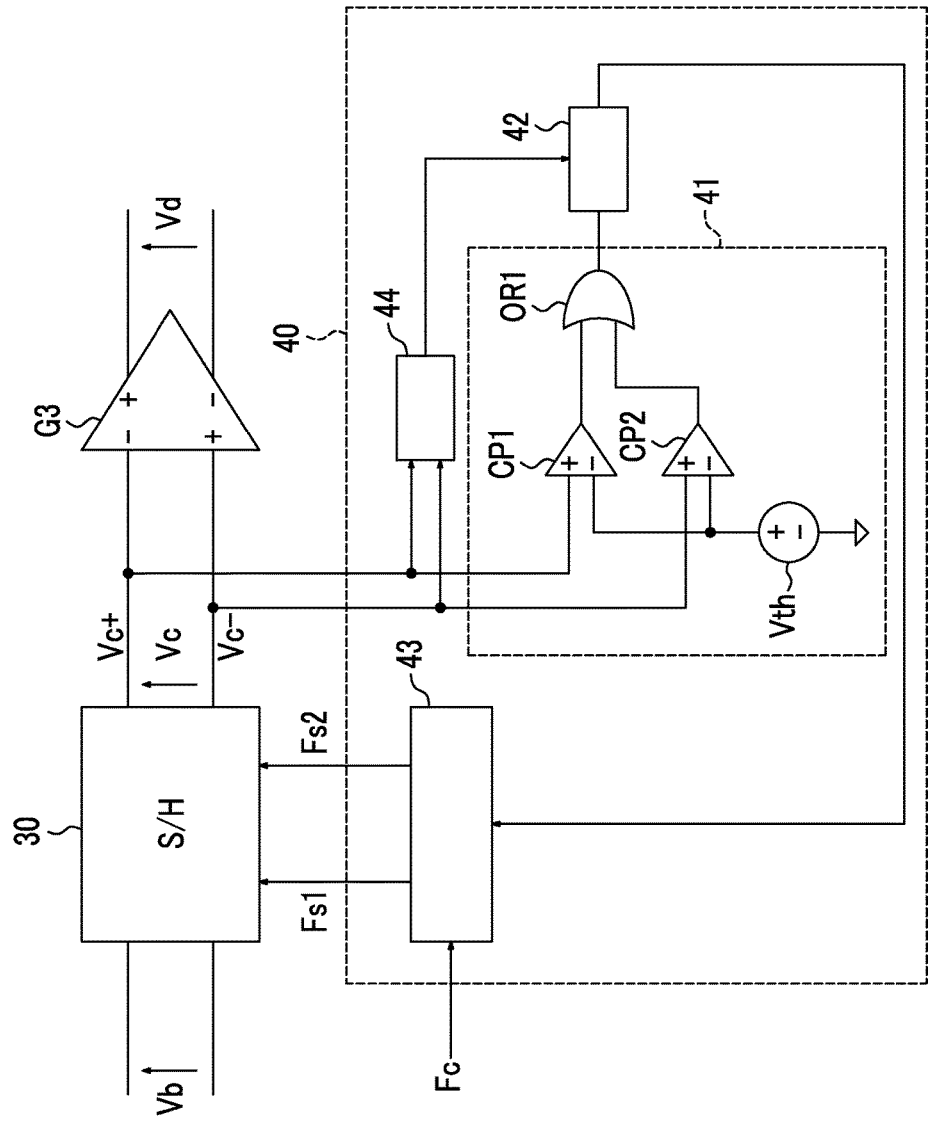
FIG. 8 is a diagram illustrating a modification example of the sample and hold circuit.

The sample and hold control circuit 40 illustrated in FIG. 8 includes a configuration in the same manner as that of the sample and hold control circuit 40 illustrated in FIG. 1, and includes a detection circuit 44 which detects the rate of change in the output voltage Vb of the sample and hold circuit 30 with respect to time. The delay circuit 42 changes delay time in accordance with the rate of change in the output voltage Vb with respect to time which is detected by the detection circuit 44. That is, the delay circuit 42 lengthens the delay time, as the rate of change in the output voltage Vb with respect to time decreases (as the output voltage Vb changes slowly), and shortens the delay time, as the rate of change in the output voltage Vb with respect to time increases (as the output voltage Vb changes fast). As a result, since the delay time of the delay circuit 42 is adjusted to a proper length in accordance with the rate of change in the output voltage Vb with respect to time, it is possible to further shorten the time needed for the negative feedback control to return to a normal state, compared to a case in which the delay time is set to a fixed value.

Second Embodiment

Next, a second embodiment of the present invention will be described.

The present embodiment relates to a current sensor of a magnetic balance type which uses an output circuit according to the present invention.

Figure 9:
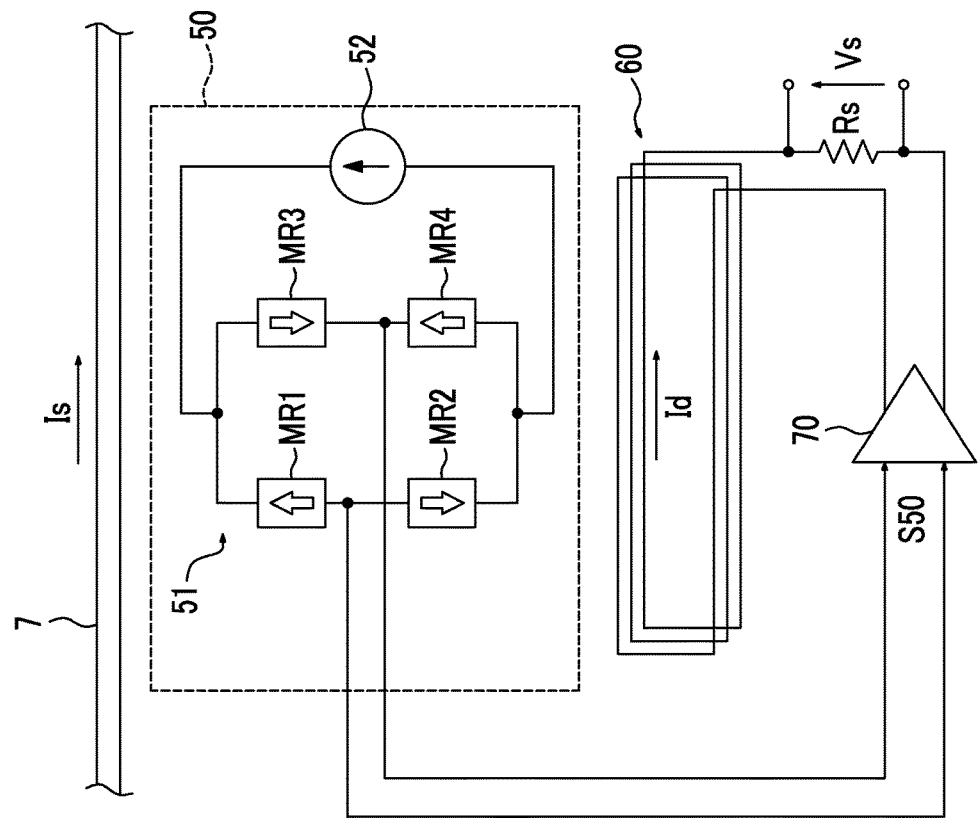
FIG. 9 is a diagram illustrating an example of a configuration of a current sensor according to a second embodiment of the present invention.

FIG. 9 is a diagram illustrating an example of a configuration of the current sensor according to the second embodiment of the present invention. The current sensor illustrated in FIG. 9 includes a magnetic sensor 50 which outputs a detection signal S50 according to a magnetic field due to a measured current Is flowing through a conductor 7, a coil 60 that generates a magnetic field in a direction in which the magnetic field due to the measured current Is acting on the magnetic sensor 50 is cancelled, and a coil drive circuit 70.

In the example of FIG. 9, the magnetic sensor 50 includes four magnetic resistance effect elements MR1 to MR4 which configure a bridge circuit 51, and a constant current source 52 which supplies a constant current to the bridge circuit 51. In a case in which a balance between the magnetic field due to the measured current Is and the magnetic field due to a current Id flowing through the coil 60 are maintained, the detection signal S50 becomes a predetermined reference level. In a case in which the balance between the two magnetic fields are not maintained, the detection signal S50 becomes greater than the reference level, or smaller than the reference level, in accordance with the magnitude of the two magnetic fields.

The coil drive circuit 70 drives the coil 60 so as to maintain a balance between the magnetic field due to the measured current Is acting on the magnetic sensor 50 and the magnetic field due to the current Id flowing through the coil 60, in accordance with the detection signal S50 which is output from the magnetic sensor 50. That is, the coil drive circuit 70 performs negative feedback control of the current Id of the coil 60, such that a level of the detection signal S50 is the same as the reference level described above.

The current Id of the coil 60 is approximately proportional to the measured current Is, and represents a measured result of the measured current Is. The current Id is output as a voltage Vs which is generated across a shunt resistor Rs connected to the coil 60, as illustrated in, for example, FIG. 9.

Since the coil drive circuit 70 includes the amplification circuit according to the embodiment of the present invention described above, in order to amplify the detection signal S50 which is output from the magnetic sensor 50. For this reason, it is possible to measure the measured current Is flowing through the conductor 7 from a DC current to a high frequency with high accuracy. In addition, even in a case in which a measured value is scaled to a maximum value by an excessive measured current Is, if the measured current Is decreases to a measurable level, the measured value rapidly conform to the measured current Is, and thus it is possible to obtain a correct measure value.

As such, the embodiments of the present invention are described, but the present invention is not limited to the aforementioned embodiments, and includes various variations. That is, the circuit configurations which are used for the aforementioned embodiments are just examples, and can be replaced with other circuits which represent the same functions. For example, in the aforementioned embodiments, an example in which an operational amplifier of a fully differential type is used as a differential amplifier is described, but an operational amplifier of a single output type, or the like may be used in other embodiments.

In addition, the aforementioned embodiments determine whether or not the input offset voltage is deviated from the predetermined range, on the basis of the output voltage Vc of the sample and hold circuit 30 in the sample and hold control circuit 40, but the present invention is not limited to this. For example, other embodiment of the present invention may perform the determination on the basis of the output voltage Vb of the low pass filter 20 which is input to the sample and hold circuit 30.

In addition, in the aforementioned embodiment, all of the switch circuits SW1 to SW4 are turned on, in a case in which the signal retaining operation of the sample and hold circuit 30 stops, but the present invention is not limited to this. In other embodiments of the present invention, only a portion of the switch circuits may be turned on, or only a portion of switching elements included in each switch circuit may be turned on.

It should be understood by those skilled in the art that various modifications, combinations, sub-combinations and alterations may occur depending on design requirements and other factors, insofar as they are within the scope of the appended claims of the equivalents thereof.

What is claimed is:

1. An amplification circuit comprising:
a main amplification circuit including a plurality of amplification stages connected in cascade, the main amplification circuit being configured to perform negative feedback from an output thereof to an input thereof; and
an offset correction circuit configured to correct an input offset voltage of the main amplification circuit,
wherein the offset correction circuit includes:
a chopper amplification circuit configured to amplify the input offset voltage;
a low pass filter provided in a rear stage of the chopper amplification circuit;
a sample and hold circuit configured to retain an output signal of the low pass filter in synchronization with a chopper operation of the chopper amplification circuit, and to output the retained signal to a rear stage thereof;
a correction signal supply circuit configured to receive an output signal of the sample and hold circuit and supply a correction signal to an intermediate node of the plurality of amplification stages according to the output signal of the sample and hold circuit; and
a control circuit configured to control the sample and hold circuit such that, if the input offset voltage deviates from a predetermined range, the sample and hold circuit stops retaining the output signal of the low pass filter and directly outputs the output signal of the low pass filter to the correction signal supply circuit.

2. A current sensor comprising:
a magnetic sensor configured to output a detection signal according to a first magnetic field applied from a current to be measured;
a coil configured to generate, via a current flowing therethrough, a second magnetic field in a direction in which the first magnetic field applied to the magnetic sensor is cancelled; and
a coil drive circuit configured to drive the coil so as to maintain a balance between the first magnetic field and the second magnetic field in accordance with the detection signal,
wherein the coil drive circuit includes the amplification circuit according to claim 1.

3. The amplification circuit according to claim 1, wherein, when the input offset voltage returns within the predetermined range after having been deviated therefrom, the control circuit controls the sample and hold circuit such that the sample and hold circuit restarts retaining the output signal of the low pass filter a predetermined delay time period after the input offset voltage returns within the predetermined range.

4. The amplification circuit according to claim 3, wherein the control circuit determines whether or not the input offset voltage is within the predetermined range based on the output signal of the sample and hold signal or an input signal of the sample and hold circuit.

5. The amplification circuit according to claim 4, wherein the control circuit detects a rate of change in the output signal or the input signal of the sample and hold circuit with respect to time, and adjusts the delay time period in accordance with the detected rate of temporal change.

6. The amplification circuit according to claim 1, wherein the sample and hold circuit includes:
a first capacitor and a second capacitor;
a first switch circuit which connects the first capacitor to the output of the low pass filter;
a second switch circuit which connects the first capacitor to an input of the correction signal supply circuit;
a third switch circuit which connects the second capacitor to the output of the low pass filter; and
a fourth switch circuit which connects the second capacitor to the input of the correction signal supply circuit, and
wherein, if the input offset voltage is within the predetermined range, the control circuit controls the sample and hold circuit such that the sample and hold circuit alternately switches between a first switching state and a second switching state at each cycle of the chopper operation, the first switch circuit and the fourth switch circuit being turned on and the second switch circuit and the third switch circuit being turned off in the first switching state, and the first switch circuit and the fourth switch circuit being turned off and the second switch circuit and the third switch circuit being turned on in the second switching state.

7. The amplification circuit according to claim 6, wherein the control circuit turns on all of the first switch circuit, the second switch circuit, the third switch circuit, and the fourth switch circuit when the sample and hold circuit is controlled to stop retaining the output signal of the low pass filter.

8. The amplification circuit according to claim 6, wherein the control circuit controls the sample and hold circuit to switch between the first switching state and the second switching state at an intermediate timing between a first timing at which a signal level in the chopper amplification circuit is switched and a second timing at which the signal level in the chopper amplification circuit is switched again after the first timing.

* * * * *